(12) United States Patent
Aritome (10) Patent No.: US 9,070,421 B2
(45) Date of Patent: Jun. 30, 2015

(54) PAGE BUFFER CIRCUIT AND NONVOLATILE MEMORY DEVICE HAVING THE SAME

(75) Inventor: Seiichi Aritome, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 703 days.

(21) Appl. No.: 13/467,169

(22) Filed: May 9, 2012

(65) Prior Publication Data

US 2013/0182504 A1    Jul. 18, 2013

(30) Foreign Application Priority Data

Jan. 16, 2012 (KR) .................... 10-2012-0004936

(51) Int. Cl.
| | | |
|---|---|---|
| G11C 16/04 | (2006.01) | |
| G11C 7/00 | (2006.01) | |
| G11C 7/02 | (2006.01) | |
| G11C 16/06 | (2006.01) | |
| G11C 16/24 | (2006.01) | |
| G11C 7/18 | (2006.01) | |
| H01L 27/115 | (2006.01) | |

(52) U.S. Cl.
CPC .............. *G11C 7/02* (2013.01); *G11C 16/0483* (2013.01); *G11C 16/06* (2013.01); *G11C 16/24* (2013.01); *G11C 7/18* (2013.01); *H01L 27/11519* (2013.01); *H01L 27/11524* (2013.01)

(58) Field of Classification Search
CPC ........ G11C 16/02; G11C 16/04; G11C 16/06; G11C 16/26; G11C 7/06; G11C 11/5621; G11C 16/0408; G11C 16/349; G11C 7/18; G11C 16/00; G11C 5/025; G11C 5/063; G11C 16/24
See application file for complete search history.

(56) References Cited

U.S. PATENT DOCUMENTS

| | | | | |
|---|---|---|---|---|
| 7,239,561 B2 * | 7/2007 | Park | .................. | 365/189.07 |
| 7,551,466 B2 | 6/2009 | Aritome | | |
| 7,638,878 B2 | 12/2009 | Aritome | | |
| 2003/0117856 A1 * | 6/2003 | Lee et al. | .................. | 365/189.05 |
| 2007/0247928 A1 * | 10/2007 | Park | .................. | 365/189.05 |
| 2012/0307565 A1 * | 12/2012 | Aritome | .................. | 365/185.22 |

FOREIGN PATENT DOCUMENTS

| | | |
|---|---|---|
| JP | 2002-237531 | 8/2002 |
| KR | 100186105 | 4/1999 |
| KR | 1020090050775 | 5/2009 |

OTHER PUBLICATIONS

Preliminary Rejection issued by the Korean Intellectual Property Office on Jan. 30, 2013.

* cited by examiner

*Primary Examiner* — Hien Nguyen
(74) *Attorney, Agent, or Firm* — IP & T Group LLP (57) ABSTRACT

A page buffer circuit includes first and second bit lines coupled to a first sensing circuit and with a first space therebetween, and third and fourth bit lines coupled to a second sensing circuit and with the first space therebetween. The second bit line and the third bit line are adjacent to each other with a second space therebetween, and the second space is smaller than the first space.

17 Claims, 9 Drawing Sheets

PAGE BUFFER CIRCUIT AND NONVOLATILE MEMORY DEVICE HAVING THE SAME

CROSS-REFERENCE TO RELATED APPLICATIONS

The present application claims priority of Korean Patent Application No. 10-2012-0004936, filed on Jan. 16, 2012, which is incorporated herein by reference in its entirety.

BACKGROUND

1. Field

Exemplary embodiments of the present invention relate to a nonvolatile memory device, and more particularly, to a page buffer circuit and a nonvolatile memory device having the same.

2. Description of the Related Art

Memory devices are provided as internal storage devices of systems, for example, computers. The memory devices include an array of memory cells for storing data (hereinafter, referred to as a memory cell array) and row and column decoder circuits coupled to the memory cell array and configured to access the memory cell array in response to an external address.

One type of memory includes a nonvolatile memory known as, for example, a flash memory. The flash memory includes a memory cell array configured to store data and a plurality of page buffers configured to read data.

The memory cell array includes a plurality of strings which are electrically coupled to the respective page buffers through bit lines. Furthermore, each of the strings includes a plurality of memory cells coupled in series, and each of the memory cells includes a source, a drain, a floating gate, and a control gate.

The page buffer includes a bit line selector. The bit line selector is configured to select a bit line coupled to a string of the memory cell array. For example, the bit line selector includes bit line selection transistors composed of metal-oxide semiconductor field-effect transistors (MOSFET) and the like.

Figure 1:
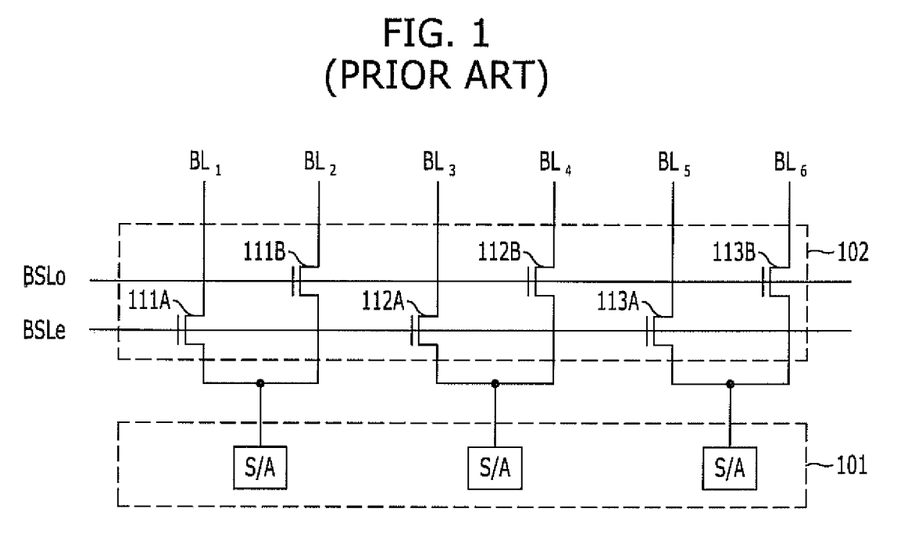
FIG. 1 illustrates a conventional page buffer circuit.

FIG. 1 illustrates a conventional page buffer circuit.

Referring to FIG. 1, the page buffer circuit may include a sensing circuit 101 and a bit line selection circuit 102.

A plurality of bit lines $BL_1$ to $BL_6$ are coupled to the bit line selection circuit 102 and selectively coupled to the sensing circuit 101 by the bit line selection circuit 102. The bit line selection circuit 102 includes a plurality of selection transistors 111A, 111B, 112A, 112B, 113A, and 113B having gates coupled to a selection line BSLe or BSLo in common. The plurality of bit lines $BL_1$ to $BL_6$ are coupled to the sources/drains of the selection transistors 111A, 111B, 112A, 112B, 113A, and 113B, respectively.

In FIG. 1, the plurality of bit lines $BL_1$ to $BL_6$ are formed at the same level. Therefore, coupling interference may occur between adjacent bit lines.

SUMMARY

Exemplary embodiments of the present invention are directed to a page buffer circuit capable of reducing coupling interference and a nonvolatile memory device having the same.

In accordance with an exemplary embodiment of the present invention, a page buffer circuit includes first and second bit lines coupled to a first sensing circuit and adjacent to each other with a first space therebetween, and third and fourth bit lines coupled to a second sensing circuit and adjacent to each other with the first space therebetween. The second bit line and the third bit line are adjacent to each other with a second space therebetween, and the second space is smaller than the first space. The page buffer circuit may further include a first selection transistor configured to couple the first bit line and the first sensing circuit, a second selection transistor configured to couple the second bit line and the first sensing circuit, a third selection transistor configured to couple the third bit line and the second sensing circuit, a fourth selection transistor configured to couple the fourth bit line and the second sensing circuit, a first selection line configured to couple a gate of the first selection transistor and a gate of the fourth selection transistor, and a second selection line configured to couple a gate of the second selection transistor and a gate of the third selection transistor. The first to fourth bit lines may be formed at the same level. The first bit line and the third bit line may be formed at a first level, the second bit line and the fourth bit line may be formed at a second level, and the first level may be different from the second level.

In accordance with another embodiment of the present invention, a nonvolatile memory device includes a plurality of strings each having a plurality of memory cells coupled in series, and a plurality of page buffer circuits configured to read data stored in the memory cells. Each of the page buffer circuits includes a pair of first and second bit lines coupled to a first sensing circuit and with a first space therebetween, and a pair of third and fourth bit lines coupled to a second sensing circuit and with the first space therebetween, and the second bit line and the third bit line are adjacent to each other with a second space therebetween, and the second space is smaller than the first space.

In accordance with another embodiment of the present invention, a page buffer circuit includes a plurality of bit line pairs each including first and second bit lines adjacent to each other with a first space therebetween, a plurality of sensing circuits configured to sense voltage levels of the respective bit line pairs, and a selection circuit configured to couple the bit line pairs to the sensing circuits in response to first and second control signals, wherein adjacent bit lines belonging to different bit line pairs of the bit lines pairs have a second space smaller than the first space therebetween.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
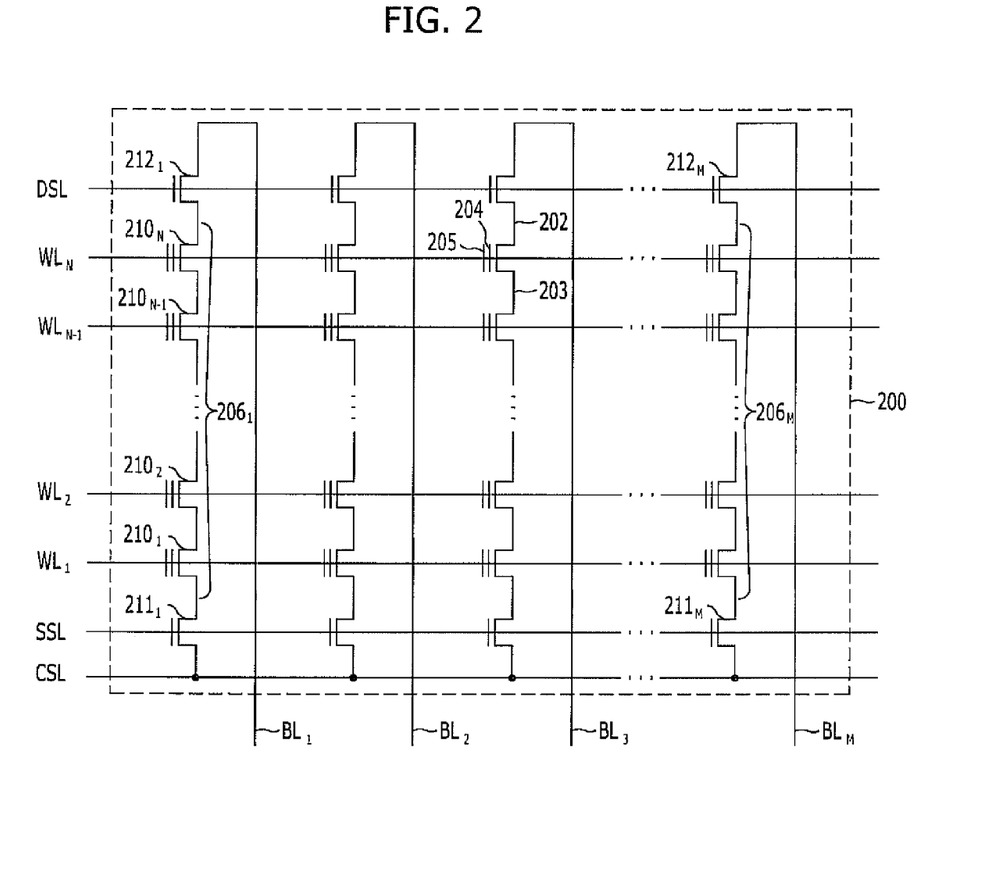
FIG. 2 is a schematic diagram of a memory array in accordance with an exemplary embodiment of the present invention.

FIG. 2 is a schematic diagram of a memory array in accordance with an exemplary embodiment of the present invention.

Referring to FIG. 2, the memory array 200 includes a plurality of word lines $WL_1$ to $WL_N$ and a plurality of bit lines $BL_1$ to $BL_M$ crossing the plurality of word lines $WL_1$ to $WL_N$. The plurality of bit lines $BL_1$ to $BL_M$ are formed as different levels of layers on a substrate.

The memory array 200 includes a plurality of strings $206_1$ to $206_M$. Each of the strings, e.g., the string $206_1$ include a plurality of memory cell transistors $210_1$ to $210_N$ arranged at the intersections between the word lines $WL_1$ to $WL_N$ and the corresponding bit line $BL_1$. The memory cell transistors $210_1$ to $210_N$ indicate nonvolatile memory cells for storing data. The memory cell transistors of the strings $206_1$ to $206_M$ are coupled in series between a source selection line SSL and a drain selection line DSL. The memory array 200 includes a plurality of source selection transistors $211_1$ to $211_M$ at the intersections between the strings $206_1$ to $206_M$ and the source selection line SSL. The memory array 200 includes a plurality of drain selection transistors $212_1$ to $212_M$ at the intersections between the strings $206_1$ to $206_M$ and the drain selection line DSL. In this way, the memory cell transistors of the strings $206_1$ to $206_M$ are coupled between the source selection transistors $211_1$ to $211_M$ and the drain selection transistors $212_1$ to $212_M$, respectively.

The sources of the source selection transistors $211_1$ to $211_M$ are coupled to a common source line CSL, and the drains of the source selection transistors $211_1$ to $211_M$ are coupled to the sources of the first memory cell transistors of the respective strings $206_1$ to $206_M$. For example, the drain of the first source selection transistor $211_1$ is coupled to the source of the first memory cell transistor $210_1$ of the first string $206_1$ corresponding thereto.

The drains of the respective drain selection transistor $212_1$ to $212_M$ are coupled to the bit lines $BL_1$ to $BL_M$ for the strings $206_1$ to $206_M$. For example, the drain of the first drain selection transistor $212_1$ is coupled to the first bit line $BL_1$ for the first string $206_1$ corresponding thereto. The sources of the drain selection transistor $212_1$ to $212_M$ are coupled to the drains of the final memory cell transistors of the respective strings $206_1$ to $206_M$. For example, the source of the first drain selection transistor $212_1$ is coupled to the drain of the final memory cell transistor $210_N$ of the first string $206_1$ corresponding thereto.

The plurality of bit lines $BL_1$ to $BL_M$ are electrically coupled to a page buffer circuit.

Figure 3:
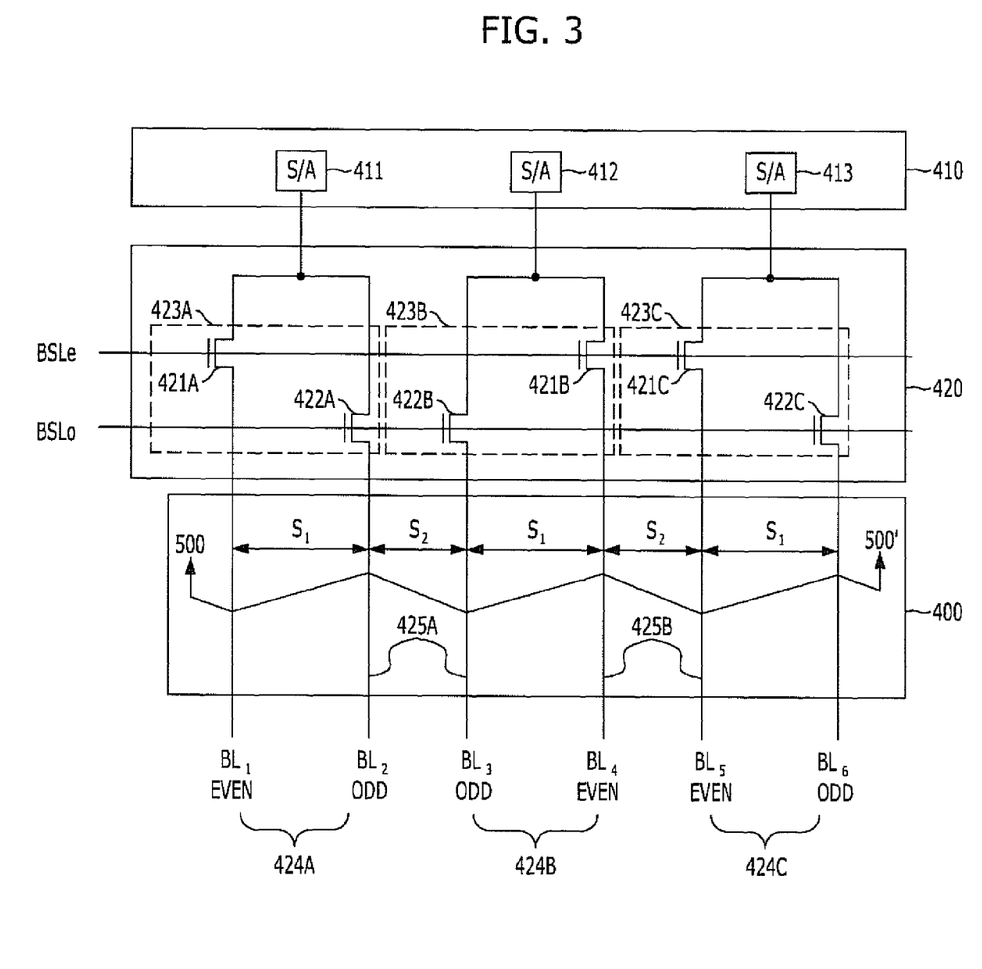
FIG. 3 illustrates a page buffer circuit shown in FIG. 2.

FIG. 3 illustrates the page buffer circuit.

Referring to FIG. 3, the page buffer circuit may include a sensing circuit 410 and a bit line selection circuit 420. The bit line selection circuit 420 is configured to select a plurality of bit lines coupled to strings of a memory cell array 400.

The plurality of bit lines $BL_1$ to $BL_6$ are selectively coupled to the sensing circuit 410 by the bit line selection circuit 420. The bit line selection circuit 420 includes a plurality of selection transistors 421A, 421B, 421C, 422A, 422B, and 422C having gates coupled to a selection line BSLe or BSLo in common. The plurality of bit lines $BL_1$ to $BL_6$ are coupled to the sources/drains of the selection transistors 421A, 421B, 421C, 422A, 422B, and 422C. The consecutive selection transistors 421A/422A, 421B/422B, and 421C/422C, which are coupled to the different selection lines BSLe and BSLo and arranged at different rows, share (or couple) their source/drain to form select transistor pairs 423A, 423B, and 423C, respectively. For example, the source/drain of the pair of selection transistors 421A and 422A coupled to the selection lines BSLe and BSLo, respectively, are coupled to each other to form the selection transistor pair 423A, and the source/drain of the pair of selection transistors 421B and 422B coupled to the selection lines BSLe and BSLo, respectively, are coupled to each other to form the selection transistor pair 423B. The selection transistor pairs 423A, 423B, and 423C are one-to-one coupled to sensing circuits 411, 412, and 413, respectively.

The bit lines $BL_1$ to $BL_6$ are one-to-one coupled to the sources/drains of the respective selection transistors 421A, 421B, 421C, 422A, 422B, and 422C. For example, the bit line $BL_1$ is coupled to the source/drain of the selection transistor 421A, and the bit line $BL_2$ is coupled to the source/drain of the selection transistor 422A. As such, the bit line $BL_1$ and the bit line $BL_2$ are coupled to the sources/drains of the consecutive selection transistors 421A and 422A of the selection transistor pair 423A, respectively. The other sources/drains of the selection transistors 421A and 422A of the selection transistor pair 423A are coupled to the sensing circuit 411.

Consecutively adjacent bit lines may form a pair. For example, the adjacent bit lines $BL_1$ and $BL_2$ coupled to the sensing circuit 411 form a bit line pair 424A, the adjacent bit lines $BL_3$ and $BL_4$ coupled to the sensing circuit 412 form a bit line pair 424B, and the adjacent bit lines $BL_5$ and $BL_6$ coupled to the sensing circuit 413 form a bit line pair 424C.

The adjacent bit lines of the bit line pair 424A, 424B, or 424C may be arranged at different levels. That is, they may be formed as different levels of layers on the substrate. For example, the adjacent bit lines $BL_1$ and $BL_2$ of the bit line pair 424A are arranged at a first vertical level L1 and a second vertical level L2, respectively. The other bit lines pairs 424B and 424C are arranged in the same manner. Furthermore, the bit lines $BL_1$ to $BL_6$ of the consecutive bit line pairs 424A, 424B, and 424C are formed on the first and second levels alternately. In another embodiment, the consecutive bit lines of the bit line pairs 424A, 424B, and 424C may be arranged at the level of the same plane.

During operation, the rows of the selection transistors 421A, 421B, 421C, 422A, 422B, and 422C are enabled in response to selection signals received in the selection lines BSLe and BSLo for the rows. The bit lines $BL_1$ to $BL_6$ coupled to the enabled rows of the selection transistors 421A, 421B, 421C, 422A, 422B, and 422C are selected at the same time. For example, the selection transistor 422A, 422B, and 422C are enabled in response to the selection signal received in the selection line BSLo, and the bit lines $BL_2$, $BL_3$, and $BL_6$ coupled to the enabled selection transistors 422A, 422B, and 422C are selected. The selection transistors 421A, 421B, and 421C are enabled in response to the selection signal received in the selection line BSLe, and the bit lines $BL_1$, $BL_4$, and $BL_5$ coupled to the enabled selection transistors 421A, 4218, and 421C are selected.

The spaces between the adjacent bit lines forming the bit line pairs 424A, 424B, and 424C are equal to each other. That is, the space between the bit lines $BL_1$ and $BL_2$, the space between the bit lines $BL_3$ and $BL_4$, and the space between the bit lines $BL_5$ and $BL_6$ are equally set to 'S1'.

A plurality of interposed bit line pairs 425A and 425B may be defined between the bit line $BL_1$ and the bit line $BL_6$. The interposed bit line pairs 425A and 425B include the adjacent bit lines $BL_2$ and $BL_3$, and $BL_4$ and $BL_5$, respectively, and the adjacent bit lines $BL_2$ and $BL_3$, and $BL_4$ and $BL_5$ of the respective interposed bit line pairs 425A and 425B are arranged at the first and second levels L1 and L2. In another embodiment, the consecutive bit lines $BL_2$, $BL_3$, $BL_4$, and $BL_5$ of the interposed bit line pairs 425A and 425B may be arranged at the level of the same plane.

Furthermore, the adjacent bit lines $BL_2$ and $BL_3$, and $BL_4$ and $BL_5$ of the respective interposed bit line pairs 425A and 425B are selectively coupled to different sensing circuits 411, 412, and 423. For example, the interposed bit line pair 425A includes the adjacent bit lines $BL_2$ and $BL_3$ which are selectively coupled to the sensing circuits 411 and 412 through the respective selection transistors 422A and 422B. The interposed bit line pair 425B includes the adjacent bit lines $BL_4$ and $BL_5$ which are selectively coupled to the sensing circuits 412 and 413 through the respective selection transistors 421B and 421C.

The spaces between the bit lines forming the interposed bit line pairs 425A and 425B are equal to each other. That is, the space between the bit lines $BL_2$ and $BL_3$ and the space between the bit lines $BL_4$ and $BL_5$ are equally set to 'S2'. Here, 'S2' is smaller than 'S1'. Therefore, the space S2 between the adjacent bit lines coupled to different sensing circuits is smaller than the space S1 between the adjacent bit lines coupled to the same sensing circuit.

By controlling the spaces between the bit lines, the coupling interference may be minimized between the bit lines. For example, when a plurality of bit lines are divided into even bit lines and odd bit lines, the even bit lines are coupled to the selection transistors enabled by the selection line BSLe, and the odd bit lines are coupled to the selection transistors enabled by the selection line BSLo. As the bit lines coupled to the selection transistors enabled by the same selection line are positioned adjacent to each other with a relatively small space therebetween, the coupling interference may be minimized between the adjacent bit lines during a page unit operation.

As the row of the selection transistors 421B and 421C, or 422A and 422B is enabled, the bit lines of the interposed bit line pair 425A or 425B coupled to the enabled row of the selection transistors may be selected at the same time. The adjacent bit lines $BL_2$ and $BL_3$ and the adjacent bit lines $BL_4$ and $BL_5$ of the interposed bit line pairs 425A and 425B, which are selected by the enabled rows of the selection transistors, may be coupled to different sensing circuits 411, 412, and 413. For example, the adjacent bit lines $BL_2$ and $BL_3$ of the interposed bit line pair 425A are coupled to the sensing circuits 411 and 412 through the selection transistors 422A and 422B, respectively, In response to the selection signal received in the selection line BSLo. Furthermore, the adjacent bit lines $BL_4$ and $BL_5$ of the interposed bit line pair 425B are coupled to the sensing circuits 412 and 413 through the selection transistors 421B and 421C, respectively, in response to the selection signal received in the selection line BSLe.

Figure 4A:
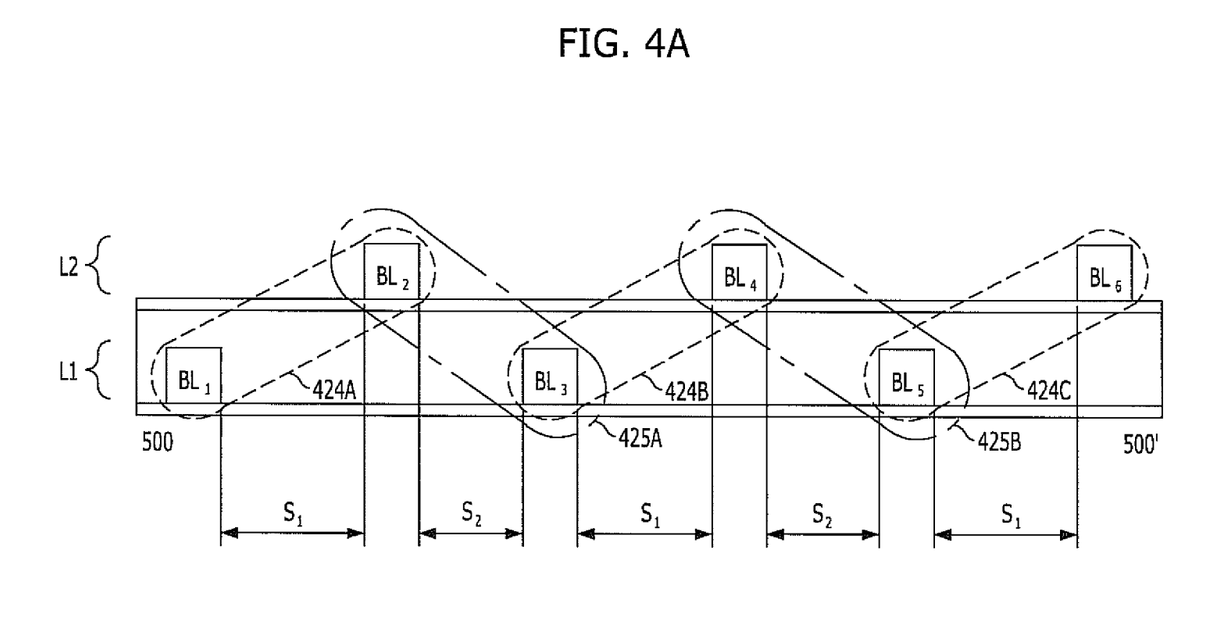
FIG. 4A is a cross-sectional view illustrating a structure of bit lines at different levels, taken along a line 500-500' shown in FIG. 3.

FIG. 4A is a cross-sectional view illustrating a structure of bit lines arranged at different levels, taken along a line 500-500' of FIG. 3.

Referring to FIG. 4A, the structure may include the bit lines $BL_1$, $BL_3$, and $BL_5$ formed at the first level L1 and the bit lines $BL_2$, $BL_4$, and $BL_6$ formed at the second level L2 different from the first level L1. For example, the second level L2 may be set above the first level L1.

As described above, the bit lines $BL_1$, $BL_3$, and $BL_5$ are formed at the first level L1, and the bit lines $BL_2$, $BL_4$, and $BL_6$ are formed at the second level L2. The adjacent bit lines which are coupled to the same sensing circuit and formed at different levels form the bit line pairs 424A, 424B, and 424C. Furthermore, the adjacent bit lines which are coupled to different sensing circuits and formed at different levels form the interposed bit line pairs 425A and 425B. The bit lines of the interposed bit line pairs 425A and 425B are coupled to the selection transistors enabled by the same selection line. The bit lines of the bit line pairs 424A, 424B, and 424C are coupled to the selection transistors enabled by different selection lines.

Figure 4B:
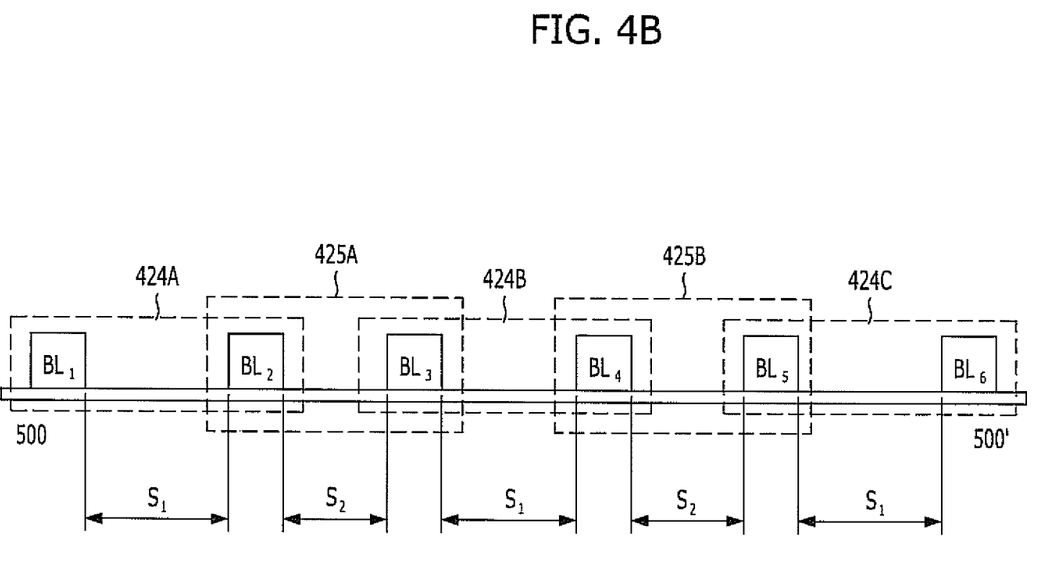
FIG. 4B is a cross-sectional view illustrating a structure of bit lines at the same level, taken along the line 500-500' shown in FIG. 3.

FIG. 4B is a cross-sectional view illustrating a structure of bit lines arranged at the same level, taken along the line 500-500' of FIG. 3.

Referring to FIG. 4B, the bit lines $BL_1$, $BL_2$, $BL_3$, $BL_4$, $BL_5$, and $BL_6$ may be arranged on the same surface. The adjacent bit lines coupled to the same sensing circuit form the bit line pairs 424A, 424B, and 424C. Furthermore, the adjacent bit lines coupled to different sensing circuits form the interposed bit line pairs 425A and 425B. The bit lines of the interposed bit line pairs 425A and 425B are coupled to selection transistors enabled by the same selection line. The bit lines of the bit line pairs 424A, 424B, and 424C are coupled to selection transistors enabled by different selection lines.

Referring to FIGS. 4A and 4B, the space S1 between the adjacent bit lines coupled to different sensing circuits is smaller than the space S1 between the adjacent bit lines coupled to the same sensing circuit. In particular, the space between the adjacent bit lines coupled to the same sensing circuit may have a significant effect upon coupling interference, and thus, it has a relatively large value. Accordingly, the coupling interference may be prevented from occurring during operation.

A bit line may be coupled to a drain of a drain selection transistor of FIG. 2 through a contact. The contact and the bit line may be formed by a dual damascene process. The dual damascene process will be described below.

The bit lines and the contacts which are formed at the first level may be formed at the same time, and the bit lines and the contacts which are formed at the second level may be formed at the same time. That is, the bit lines and the contacts formed at the same level may be formed at the same time.

Figure 5:
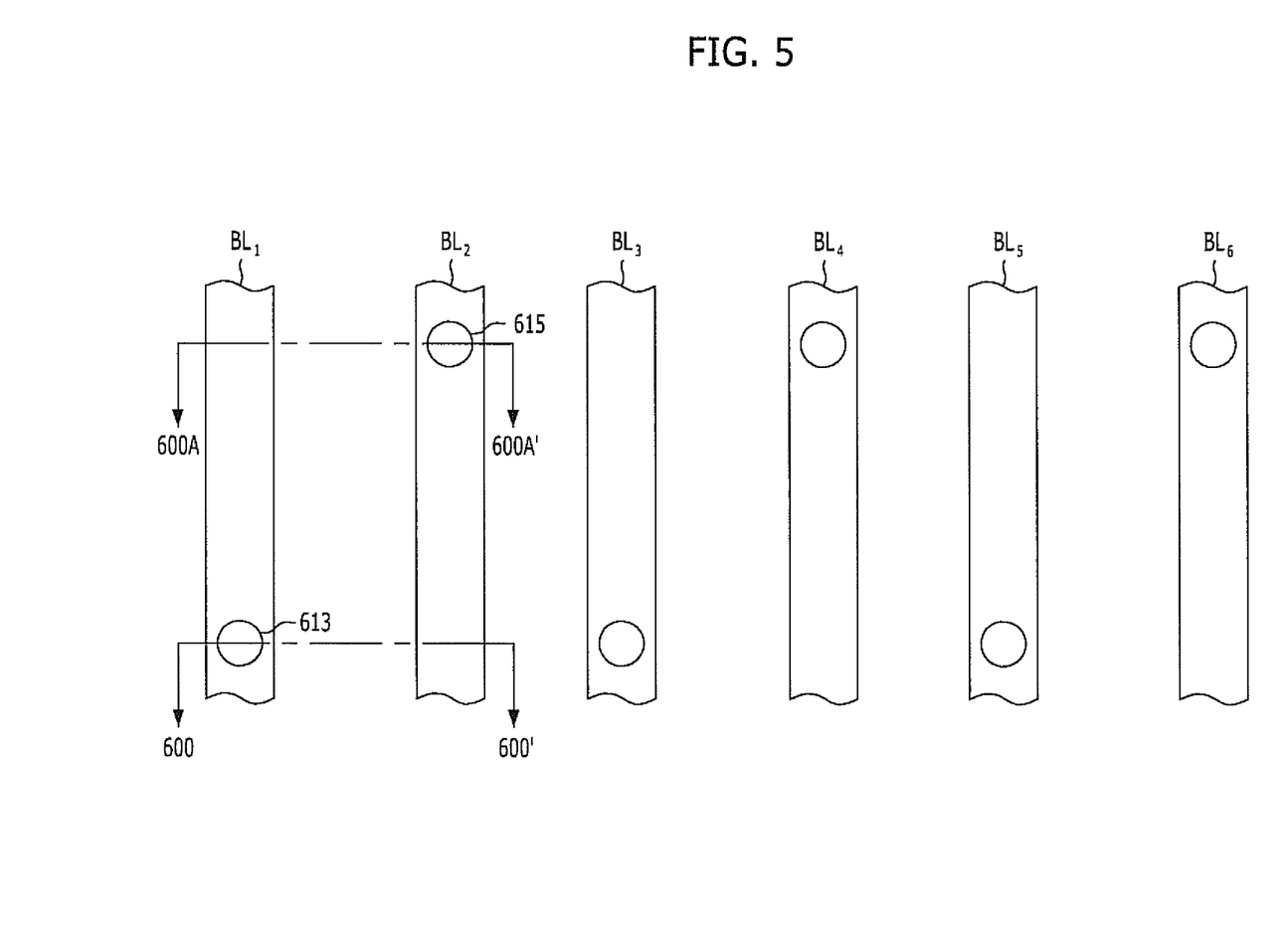
FIG. 5 illustrates the layout of the bit lines.
Figure 6A:
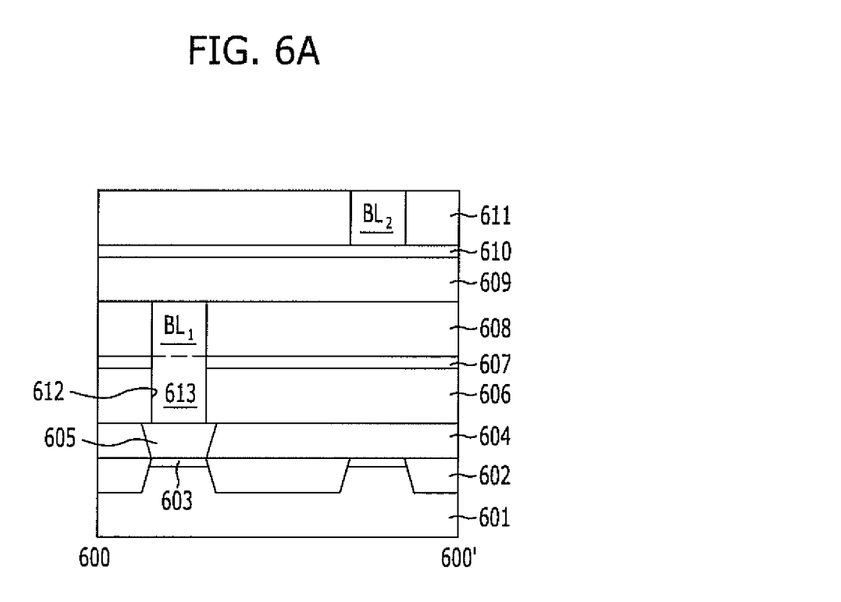
FIGS. 6A and 7A are cross-sectional views taken along a line 600-600' shown in FIG. 5.
Figure 6B:
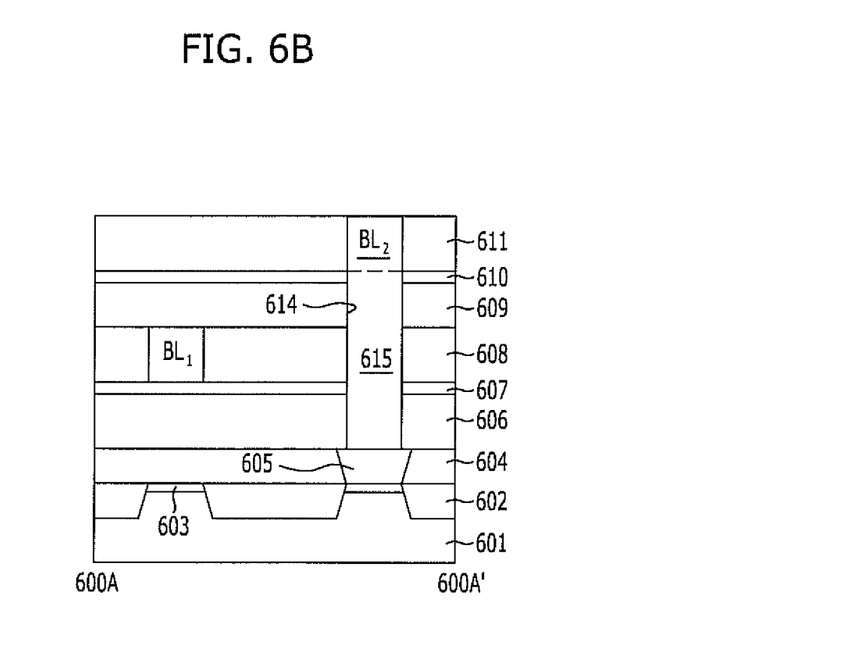
FIGS. 6B and 7B are cross-sectional views taken along a line 600A-600A' shown in FIG. 5.
Figure 7A:
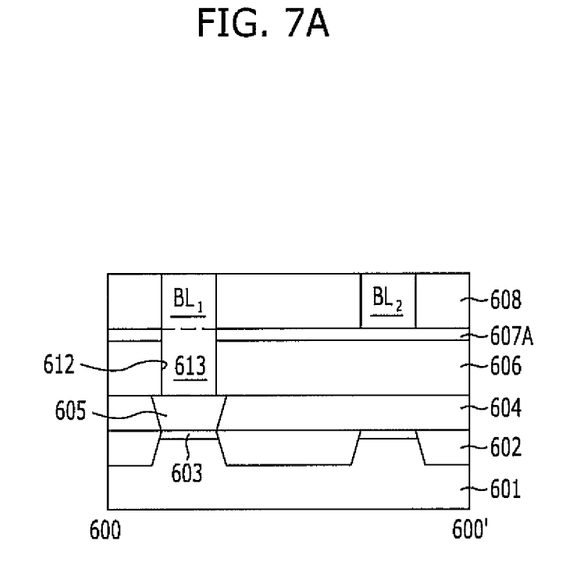
Figure 7B:
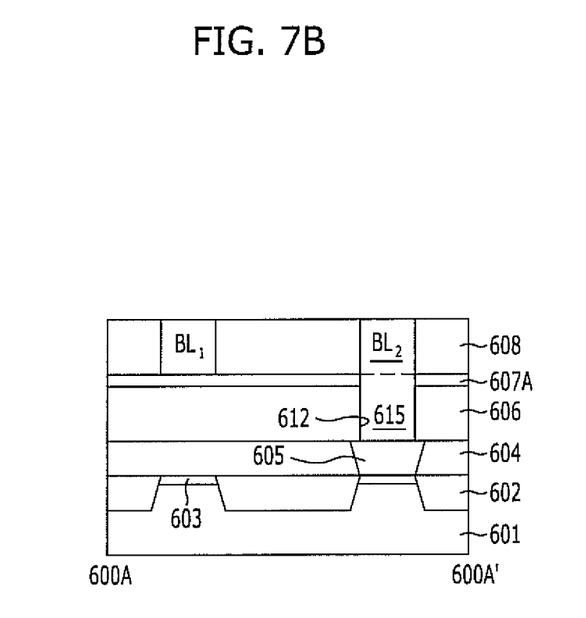

FIG. 5 illustrates the layout of the bit lines. FIGS. 6A and 7A are cross-sectional views taken along a line 600-600' of FIG. 5, and FIGS. 6B and 7B are cross-sectional views taken along a line 600A-600A' of FIG. 5. Also, FIGS. 6A and 6B are cross-sectional views in case of the bit lines arranged at different levels; and FIGS. 7A and 7B are cross-sectional views in case of the bit lines arranged at the same level.

Referring to FIGS. 5, 6A, and 6B, the plurality of bit lines $BL_1$ to $BL_6$ are arranged at set spaces between each other, and each of the bit lines $BL_1$ to $BL_6$ may be coupled to a semiconductor substrate 601 through a first contact 605.

Referring to FIGS. 6A and 6B, a bit line formation method will be described as follows.

A trench isolation layer 602 is formed in the semiconductor substrate 601 through a shallow trench isolation (STI) process. The trench isolation layer 602 defines an active area, and a doped region 603 is formed on the surface of the active area. The doped region 603 includes a source/drain region. The trench isolation layer 602 may be formed in the same manner as a memory cell illustrated in FIG. 8. For example, the widths of trenches in which the isolation layer 602 is buried may be set differently so as to correspond to the spaces between the bit lines.

A first insulation layer 604 is formed over the semiconductor substrate 601. The first insulation layer 604 may include silicon oxide such as boron phosphorus silicate glass (BPSG). The first insulation layer 604 is etched to form a contact hole, and a first contact 605 is buried in the contact hole. The first contact 605 may include tungsten.

A second insulation layer 606 is formed over the first insulation layer 604 including the first contact 605. The second Insulation layer 606 may include silicon oxide such as BPSG. A first etch stop layer 607 is formed over the second insulation layer 606. The first etch stop layer 607 may include silicon nitride.

A third insulation layer 608 is formed over the first etch stop layer 607. The third insulation layer 608 may include silicon oxide such as BPSG.

A primary dual damascene process is performed. For example, the third insulation layer 608 is etched until the first etch stop layer 607 is exposed, thereby forming a trench. Then, the first etch stop layer 607 is etched, and the second insulation layer 606 is etched to form a via hole. The via hole and the trench serve as a damascene pattern 612.

A bit line BL is buried in the damascene pattern 612. The bit line $BL_1$ may include a second contact 613, and the second contact 613 may be formed by applying a tungsten plug process. The bit line $BL_1$ may be formed by burying a tungsten layer in the damascene pattern 612 and planarizing the tungsten layer through chemical mechanical polishing (CMP) or the like. The bit line $BL_1$ is formed at the first level L1.

A fourth insulation layer 609 is formed on the entire surface of the resultant structure including the bit line $BL_1$, and a second etch stop layer 610 is formed over the fourth insulation layer 609. A fifth insulation layer 611 is formed over the second etch stop layer 610.

A secondary dual damascene process is performed. For example, the fifth insulation layer 611 is etched until the second etch stop layer 610 is exposed, thereby forming a trench. Then, the second etch stop layer 610, the fourth insulation layer 609, the third insulation layer 608, the first etch stop layer 607, and the second insulation layer 606 are etched to form a via hole. The via hole and the trench serve as a damascene pattern 614.

A bit line $BL_2$ is buried in the damascene pattern 614. The bit line $BL_2$ may include a second contact 615, and the second contact 615 may be formed by applying a tungsten plug process. The bit line $BL_2$ may be formed by burying a tungsten layer in the damascene pattern 614 and then planarizing the tungsten layer through CMP or the like. The bit line $BL_2$ is formed at the second level L2. The first level L1 is different from the second level L2. For example, the second level L2 may be set above the first level L1.

In another embodiment, the bit line $BL_1$ may be formed at the second level L2, and the bit line $BL_2$ may be formed at the first level L1.

The bit lines $BL_1$ and $BL_2$ may have the same CD (critical dimension) as the second contacts 613 and 615 or a larger CD than the second contacts 613 and 615, respectively.

As such, when the adjacent bit lines $BL_1$ and $BL_2$ are formed at different levels, a breakdown voltage (BV) distance between the bit lines is sufficiently secured. Furthermore, since bit line RC delay is reduced, the memory device may obtain excellent performance. Furthermore, the area may be efficiently utilized in the layout of the page buffer. Furthermore, during the trench formation of the dual damascene process, a dual spacer patterning technology (SPT) process may be applied.

Referring to FIGS. 7A and 7B, a bit line formation method will be described as follows.

A trench isolation layer 602 is formed in the semiconductor substrate 601 through an STI process. The trench isolation layer 602 defines an active area, and a doped region 603 is formed on the surface of the active area. The doped region 603 includes a source/drain region. The trench isolation layer 602 may be formed in the same manner as the memory cell illustrated in FIG. 8. For example, the widths of trenches, in which the isolation layer 602 is buried, may be differently set so as to correspond to the spaces between bit lines.

A first insulation layer 604 is formed over the semiconductor substrate 601. The first insulation layer 604 may include silicon oxide such as PBSG. The first insulation layer 604 is etched to form a contact hole, and a first contact 605 is buried in the contact hole. The first contact 605 may include tungsten.

A second insulation layer 606 is formed over the first insulation layer 604 including the first contact 605. The second insulation layer 606 may include silicon oxide such as BPSG. An etch stop layer 607A is formed over the second insulation layer 606. The etch stop layer 607A may include silicon nitride.

A third insulation layer 608 is formed over the etch stop layer 607A. The third insulation layer 608 may include silicon oxide such as BPSG.

A dual damascene process is performed. For example, the third insulation layer 608 is etched until the etch stop layer 607A is exposed, thereby forming a trench. Then, the etch stop layer 607A is etched, and the second insulation layer 606 is then etched to form a via hole. The via hole and the trench serve as a damascene pattern 612.

Bit lines $BL_1$ and $BL_2$ are buried in the damascene patterns 612. The bit line $BL_1$ may include a second contact 613, and the bit line $BL_2$ may includes the second contact 615, and the second contact 613 and 615 may be formed by applying a tungsten plug process. The second contact 613 and 615 may be formed at the same time. The bit lines $BL_1$ and $BL_2$ may be formed by burying a tungsten layer in the damascene pattern 612 and then planarizing the tungsten layer through CMP or the like. Since the bit lines $BL_1$ and $BL_2$ are formed at the same level, the bit lines $BL_1$ and $BL_2$ may be formed at the same time. The bit lines $BL_1$ and $BL_2$ may have the same CD as the second contact 613 and 615 or a larger CD than the second contact 613 and 615.

Figure 8:
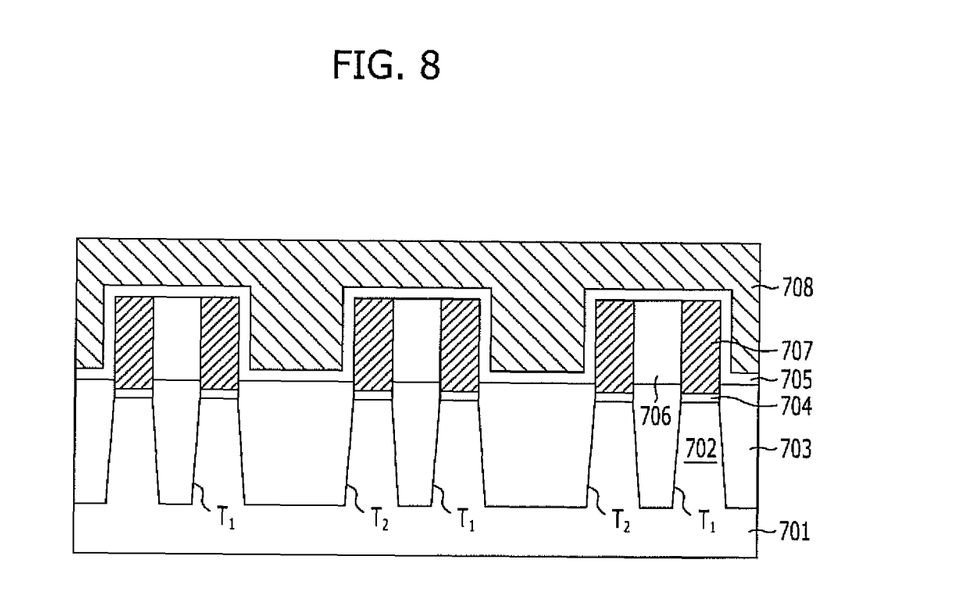
FIG. 8 illustrates memory cells shown in FIG. 2 in accordance with an exemplary embodiment of the present invention.

FIG. 8 illustrates the memory cells of FIG. 2.

Referring to FIG. 8, a plurality of active areas 702 are formed in a semiconductor substrate 701. The plurality of active areas 702 have the same CD. The plurality of active areas 702 are separated by a plurality of trenches. The plurality of trenches include first and second trenches T1 and T2 which are alternately formed. The first trench T1 has a different CD from the second trench T2. For example, the first trench T1 has a smaller CD than the second trench T2.

An isolation layer 703 is formed inside the first and second trenches T1 and T2. The surface of the isolation layer 703 is recessed.

A tunnel dielectric layer 704 and a floating gate 707 are stacked over each of the active areas 702. Therefore, since the floating gate 702 is formed to correspond to each of the active areas 702, a plurality of floating gates 707 are formed. The tunnel dielectric layer 704 may be formed of oxide, for example, silicon oxide ($SiO_2$) or may be formed by the following process: silicon oxide is formed and a heat treatment process using nitrogen ($N_2$) gas is then performed to form nitride at the interface between the silicon oxide and the active area 702. In addition, the tunnel dielectric layer 704 may be formed of a metal oxide layer having a permittivity of 3.9 or more, for example, aluminum oxide ($Al_2O_3$), zirconium oxide ($ZrO_2$), hafnium oxide ($HfO_2$), or a combined layer (or stacked layer) thereof. The floating gate 707 may be formed of any materials having conductivity, for example, polysilicon, transition metals, and rare-earth metals. For example, the polysilicon may include impurity-undoped polysilicon and impurity-doped polysilicon. In the case of the undoped polysilicon, impurity ions are separately implanted through a subsequent ion implant process. The transition metals may include iron (Fe), cobalt (Co), tungsten (W), nickel (Ni), palladium (Pd), platinum (Pt), molybdenum (Mo), and titanium (Ti), and the rare-earth metals may include erbium (Er), ytterbium (Yb), samarium (Sm), yttrium (Y), lanthanum (La), cerium (Ce), terbium (Tb), dysprosium (Dy), holmium (Ho), thulium (Tm), and ruthenium (Ru).

The plurality of floating gates 707 have the same CD, but are arranged at different spaces between each other. For example, a space between the floating gates 707 formed on the active areas 702 isolated by the second trench T2 (hereinafter, referred to as a second space) is larger than a space between the floating gates 707 formed on the active areas 702 isolated by the first trench T1 (hereinafter, referred to as a first space).

An isolation layer 706 is formed between the floating gates 707. The isolation layer 706 is formed over the first trench T1, but is not formed over the second trench T2. The isolation layer 706 may be formed as an extended portion of the trench isolation layer 703. That is, the trench isolation layer buried in the second trench T2 may be recessed, and the trench isolation layer buried in the first trench T1 may not be recessed. When the adjacent floating gates have sidewalls facing each other and sidewalls exposed to the outside, the isolation layer 706 is formed between the sidewalls facing each other.

A dielectric layer 705 is formed on the entire surface of the resultant structure including the floating gates 707 and the isolation layers 706. The dielectric layer 705 has an ONO structure in which oxide, nitride, and oxide are sequentially stacked. In addition, the dielectric layer 705 may be formed of metal oxide having a higher permittivity than the permittivity of silicon oxide, i.e., 3.9, for example, $Al_2O_3$, $ZrO_2$, $HfO_2$, and a combined layer (or stacked layer) thereof. The dielectric layer 705 is formed over the exposed sidewalls and the top surfaces of the floating gates 707. Therefore, the dielectric layer 705 is not formed on the sidewalls of the adjacent floating gates 707, which face each other.

A control gate 708 is formed over the dielectric layer 705. At this time, the control gate 708 may be formed of any one selected from conductive materials, desirably, the same material as the floating gate 707. Although not illustrated, a low-resistance metal layer for reducing the resistance of the control gate 708 may be further formed over the control gate 708. The low-resistance metal layer may include metal nitride, metal silicide, or a stacked layer thereof. For example, a tungsten nitride (WN) layer may be formed as the metal nitride layer, and a tungsten silicide ($WSi_x$) layer may be formed as the metal silicide layer.

Referring to FIG. 8, each of the floating gates 707 has one sidewall contacting with the dielectric layer 705. That is, one sidewall of the floating gate 707 contacts with the dielectric layer 705. Therefore, the dielectric layer 705 is formed between the floating gates 707 adjacent to each other with the second trench T2 interposed therebetween, but is not formed between the floating gates 707 adjacent to each other with the first trench T1 interposed therebetween.

As described above, the memory cell in accordance with the embodiment of the present invention is formed by an OS ISP SA-STI (One-Side IPD structured Self Aligned-Shallow Trench Isolation) process. The OS IPD SA-STI process is performed in such a manner that one side of both sidewalls of the floating gate 707 contacts with the dielectric layer 705. When the OS IPD SA-STI process is applied, coupling interference may be prevented from occurring between adjacent floating gates. The OS IPD SA-STI process may be applied to the selection transistors of the bit line selection circuit.

While the present invention has been described with respect to the specific embodiments, it will be apparent to those skilled in the art that various changes and modifications may be made without departing from the spirit and scope of the invention as defined in the following claims.

What is claimed is:

1. A page buffer circuit comprising:
a pair of first and second bit lines coupled to a first sensing circuit and with a first space therebetween; and
a pair of third and fourth bit lines coupled to a second sensing circuit and with the first space therebetween,
wherein the second bit line and the third bit line are adjacent to each other with a second space therebetween, and the second space is smaller than the first space.

2. The page buffer circuit of claim 1, further comprising:
a first selection transistor configured to selectively couple the first bit line and the first sensing circuit;
a second selection transistor configured to selectively couple the second bit line and the first sensing circuit;
a third selection transistor configured to selectively couple the third bit line and the second sensing circuit;
a fourth selection transistor configured to selectively couple the fourth bit line and the second sensing circuit;
a first selection line configured to couple a gate of the first selection transistor and a gate of the fourth selection transistor; and
a second selection line configured to couple a gate of the second selection transistor and a gate of the third selection transistor.

3. The page buffer circuit of claim 1, wherein the first to fourth bit lines are formed at the same layer level.

4. The page buffer circuit of claim 1, wherein the first bit line and the third bit line are formed at a first layer level, the second bit line and the fourth bit line are formed at a second layer level, and the first layer level is different from the second layer level.

5. A nonvolatile memory device comprising:
a plurality of strings each having a plurality of memory cells coupled in series; and
a plurality of page buffer circuits configured to read data stored in the memory cells,
wherein each of the page buffer circuits comprises:
a pair of first and second bit lines coupled to a first sensing circuit and with a first space therebetween; and
a pair of third and fourth bit lines coupled to a second sensing circuit and with the first space therebetween, and
the second bit line and the third bit line are adjacent to each other with a second space therebetween, and the second space is smaller than the first space.

6. The nonvolatile memory device of claim 5, wherein the page buffer circuit comprises:
- a first selection transistor configured to selectively couple the first bit line and the first sensing circuit;
- a second selection transistor configured to selectively couple the second bit line and the first sensing circuit;
- a third selection transistor configured to couple the third bit line and the second sensing circuit;
- a fourth selection transistor configured to selectively couple the fourth bit line and the second sensing circuit;
- a first selection line configured to couple a gate of the first selection transistor and a gate of the fourth selection transistor; and
- a second selection line configured to couple a gate of the second selection transistor and a gate of the third selection transistor.

7. The nonvolatile memory device of claim 5, wherein the first to fourth bit lines are formed at the same layer level.

8. The nonvolatile memory device of claim 5, wherein the first bit line and the third bit line are formed at a first layer level, the second bit line and the fourth bit line are formed at a second layer level, and the first layer level is different from the second layer level.

9. The nonvolatile memory device of claim 5, wherein each of the memory cells comprises:
- a plurality of floating gate pairs each having two floating gates and an isolation layer therebetween;
- a dielectric layer formed on the sidewalls and top surfaces of the floating gate pairs; and
- a control gate formed over the dielectric layer.

10. A page buffer circuit comprising:
- a plurality of bit line pairs each including first and second bit lines adjacent to each other with a first space therebetween;
- a plurality of sensing circuits configured to sense voltage levels of the respective bit line pairs; and
- a selection circuit configured to couple the bit line pairs to the sensing circuits in response to first and second control signals,
- wherein adjacent bit lines belonging to different bit line pairs of the bit lines pairs have a second space smaller than the first space therebetween.

11. The page buffer circuit of claim 10, wherein the selection circuit is configured to couple the first and second bit lines of the bit line pair to a corresponding sensing circuit in response to the first and second control signals, respectively, and couple the adjacent bit lines belonging to different bit line pairs to respective sensing circuits in response to one of the first and second control signals.

12. The page buffer circuit of claim 10, wherein the first and second bit lines of the bit line pair are formed at the same layer level and the adjacent bit lines belonging to different bit line pairs are formed at the same layer level.

13. The page buffer circuit of claim 10, wherein the first and second bit lines of the bit line pair are formed at different layer levels and the adjacent bit lines belonging to different bit line pairs are formed at different layer levels.

14. A nonvolatile memory device having a page buffer circuit, comprising:
- a plurality of bit line pairs each including first and second bit lines adjacent to each other with a first space therebetween;
- a plurality of sensing circuits configured to sense voltage levels of the respective bit line pairs; and
- a selection circuit configured to couple the bit line pairs to the sensing circuits in response to first and second control signals,
- wherein adjacent bit lines belonging to different bit line pairs of the bit lines pairs have a second space smaller than the first space therebetween.

15. The nonvolatile memory device of claim 14, wherein the selection circuit is configured to couple the first and second bit lines of the bit line pair to a corresponding sensing circuit in response to the first and second control signals, respectively, and couple the adjacent bit lines belonging to different bit line pairs to respective sensing circuits in response to one of the first and second control signals.

16. The nonvolatile memory device of claim 15, wherein the first and second bit lines of the bit line pair are formed at the same layer level and the adjacent bit lines belonging to different bit line pairs are formed at the same layer level.

17. The nonvolatile memory device of claim 16, wherein the first and second bit lines of the bit line pair are formed at different layer levels and the adjacent bit lines belonging to different bit line pairs are formed at different layer levels.

* * * * *